United States Patent [19]

Hawkswell

[11] Patent Number: 4,770,599

[45] Date of Patent: * Sep. 13, 1988

[54] PICK-UP HEAD FOR HANDLING ELECTRIC COMPONENTS

[75] Inventor: Victor T. Hawkswell, Witham, England

[73] Assignee: Dynapert Precima Limited, England

[*] Notice: The portion of the term of this patent subsequent to Nov. 25, 2003 has been disclaimed.

[21] Appl. No.: 776,973

[22] PCT Filed: Jan. 23, 1984

[86] PCT No.: PCT/GB84/00016

§ 371 Date: Sep. 12, 1985

§ 102(e) Date: Sep. 12, 1985

[87] PCT Pub. No.: WO85/03405

PCT Pub. Date: Aug. 1, 1985

[51] Int. Cl.$^4$ .............................................. B65G 1/00
[52] U.S. Cl. ..................................... 414/752; 29/568; 294/2; 414/744 B; 901/39; 901/40
[58] Field of Search .................. 294/2, 64.1; 29/740, 29/741, 759, 834, 568; 414/120, 121, 606, 627, 737, 744 A, 744 B, 752, 222–225; 271/9, 30 R, 108; 269/23, 156; 901/40, 31, 39

[56] References Cited

U.S. PATENT DOCUMENTS

| | | | |
|---|---|---|---|
| 3,676,911 | 7/1972 | Austin | 29/743 X |
| 3,958,740 | 5/1976 | Dixon | 901/40 X |
| 4,103,405 | 8/1978 | Blum et al. | 29/568 X |
| 4,135,630 | 1/1979 | Snyder et al. | 29/740 X |
| 4,151,945 | 5/1979 | Ragard et al. | 29/740 X |
| 4,290,732 | 9/1981 | Taki et al. | 414/752 |
| 4,346,514 | 8/1982 | Makizawa et al. | 29/740 |
| 4,359,815 | 11/1982 | Toyoda | 414/225 X |
| 4,381,601 | 5/1983 | Tamai et al. | 29/740 |
| 4,437,232 | 3/1984 | Araki et al. | 29/740 |
| 4,451,976 | 6/1984 | Fujita et al. | 29/740 |
| 4,473,247 | 9/1984 | Itemadani et al. | 294/2 |
| 4,494,902 | 1/1985 | Kuppens et al. | 414/223 |
| 4,505,020 | 3/1985 | Kinoshita | 29/568 |
| 4,515,507 | 5/1985 | Asai et al. | 294/2 X |
| 4,527,327 | 7/1985 | Van Deuren | 29/740 |
| 4,557,035 | 12/1985 | Rütschle et al. | 29/568 |
| 4,572,564 | 2/1986 | Cipolla | 901/39 X |
| 4,599,037 | 7/1986 | Ross, Jr. et al. | 29/740 X |
| 4,610,473 | 9/1986 | Hawkswell | 294/64.1 |
| 4,611,397 | 9/1986 | Janisiewicz et al. | 29/834 |
| 4,624,050 | 11/1986 | Hawkswell | 294/2 X |
| 4,627,785 | 12/1986 | Monforte | 901/39 X |
| 4,723,353 | 2/1988 | Monforte | 901/39 X |

FOREIGN PATENT DOCUMENTS 014940 9/1980 European Pat. Off. .

OTHER PUBLICATIONS

Cummins et al., "Removable Robotic Devices", IBM Tech. Disc. Bul., vol. 24, No. 7A, 12/1981.

Primary Examiner—Robert J. Spar
Assistant Examiner—Jennifer L. Doyle
Attorney, Agent, or Firm—Spencer T. Smith

[57] ABSTRACT

A pick-up head especially for use in a machine for placing electrical components on a substrate comprises a tool holder having means for interchangeably mounting a pick-up tool with a datum face located at a predetermined position relative to a datum position. The datum position of each tool is defined by the nose length of each tool. The pick-up head further comprises a plurality of orienting jaws mounted for movement towards and away from a component carried by and abutting the datum face of the tool when the holder is in the datum position whereby the jaws can engage the component to orient the component. The jaws have a plurality of spaced sets of cooperating datum faces disposed generally transversely to the plane of the datum face of the tool in the holder. Each set of cooperating faces being disposed so as to be capable of orienting a component carried by a corresponding tool having its datum face located relative to the datum position of the holder. A machine including the pick-up head comprises a tool support for supporting a plurality of tools and the machine is arranged so that tools carried by the pick-up head may be interchanged with tools in the tool support dependent upon the components which are to be handled. A wide range of component sizes can be handled using the single pick-up head.

18 Claims, 5 Drawing Sheets

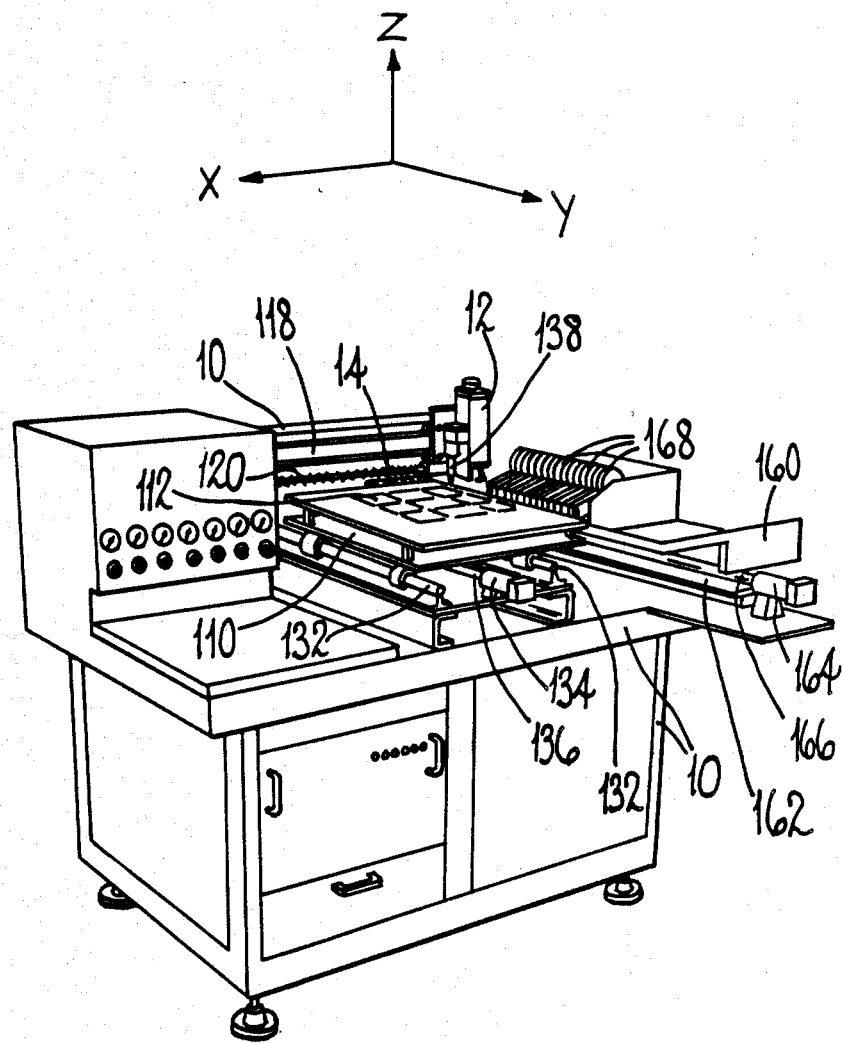
Fig_1

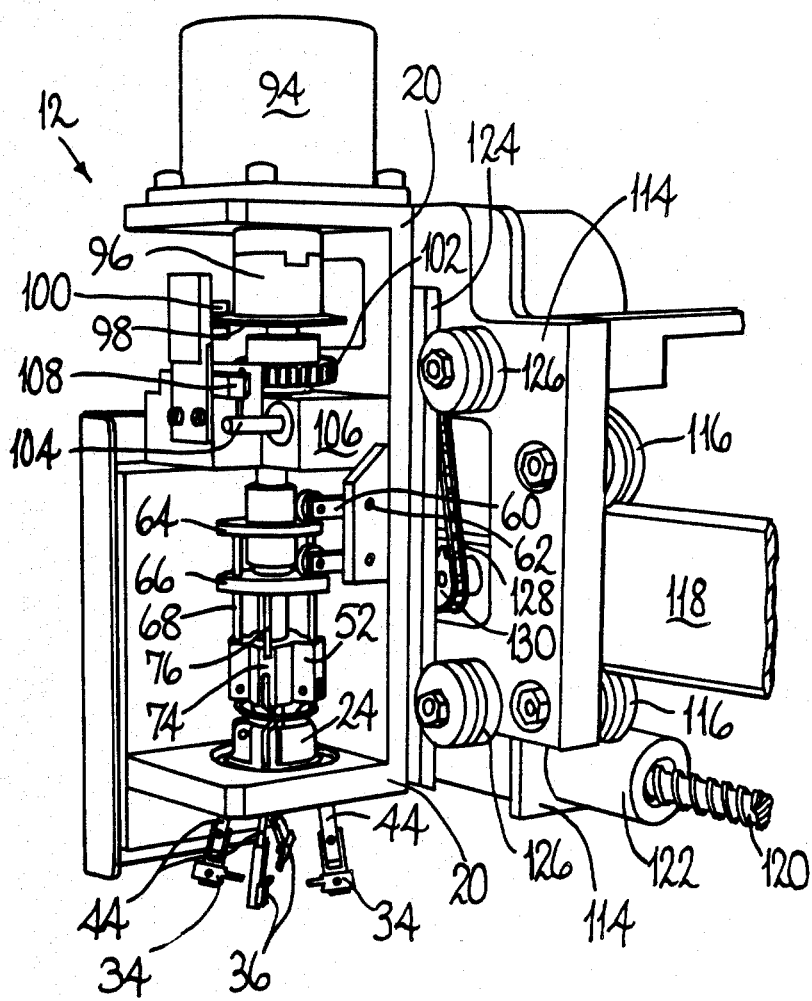
FIG_2

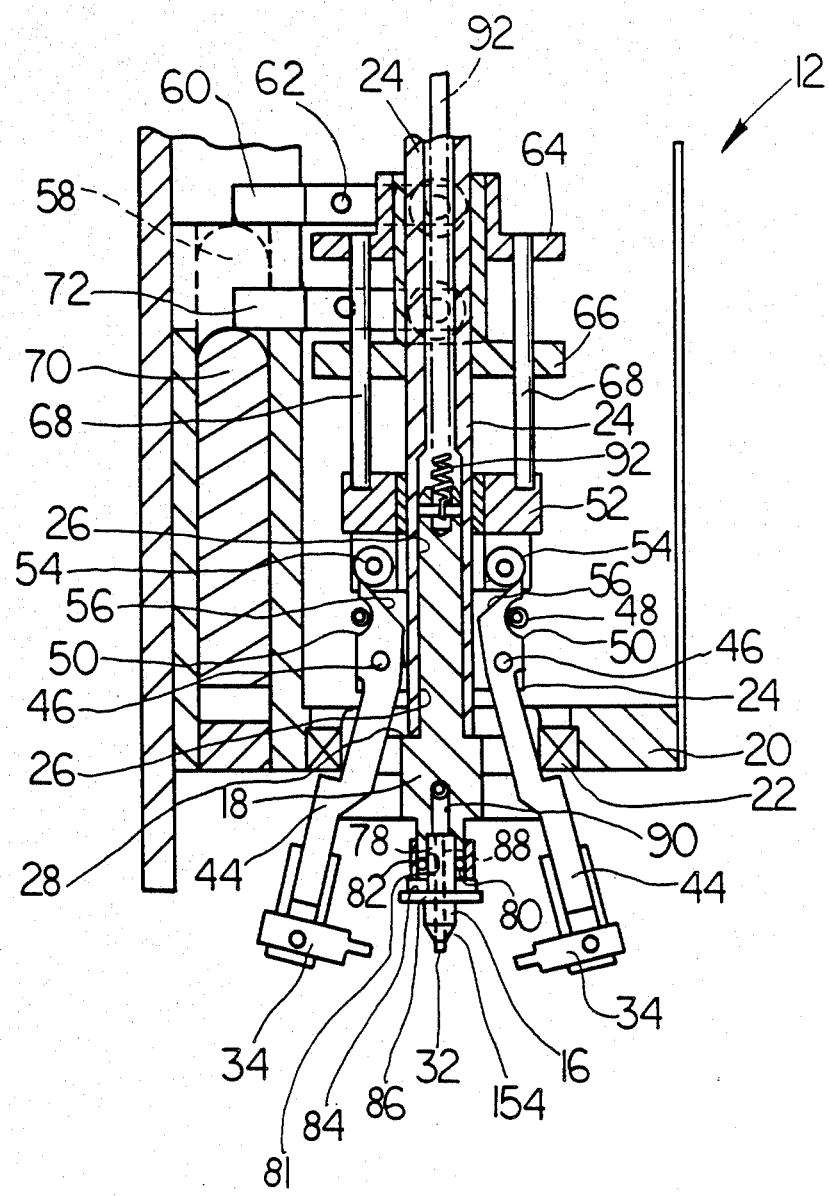
Fig_3

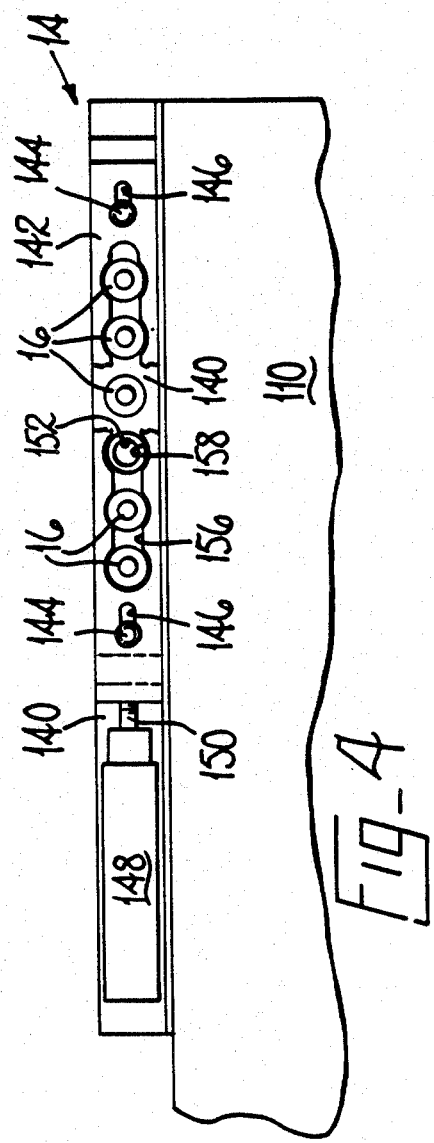
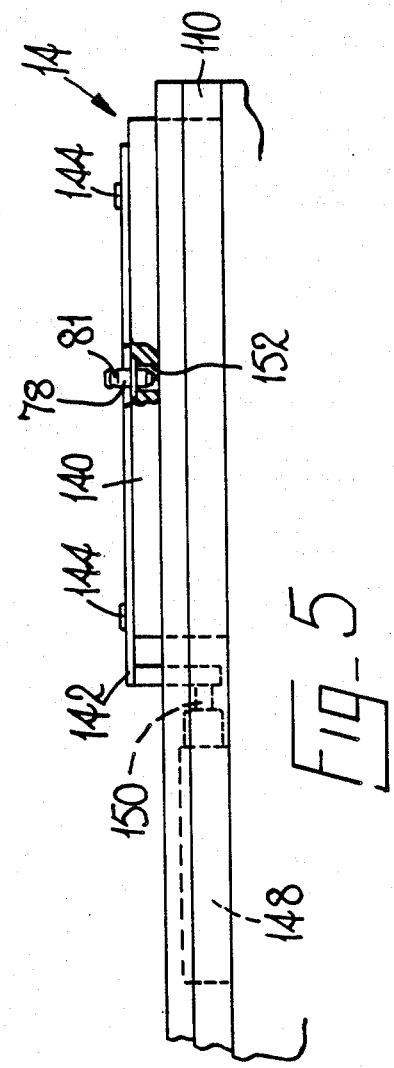

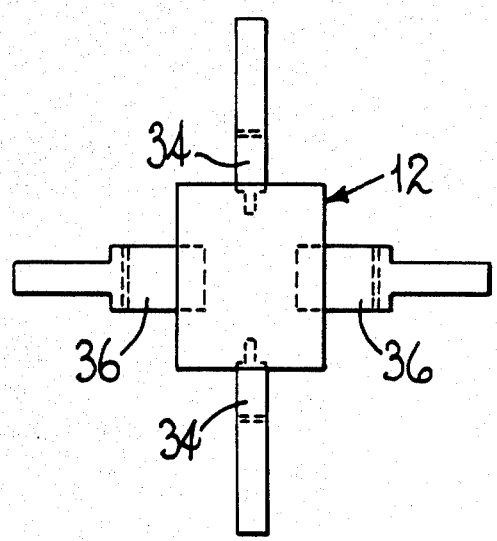
Fig_6
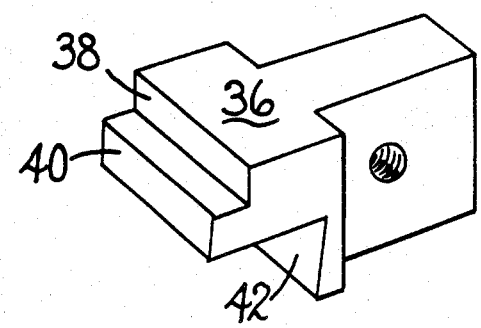
Fig_7
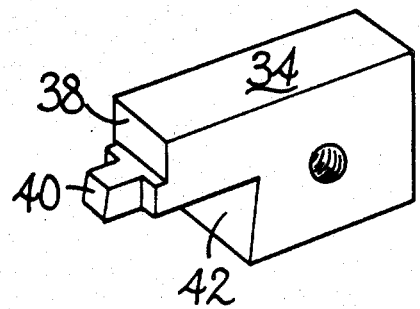
Fig_8

PICK-UP HEAD FOR HANDLING ELECTRIC COMPONENTS

FIELD OF THE INVENTION

This invention relates to pick-up heads for handling electrical components, for example so-called "chips", flatpacks, certain style transistors, leadless chip carriers and the like, and to machines for handling electrical components comprising such pick-up heads.

BACKGROUND OF THE INVENTION

It is necessary to handle electrical components for a variety of purposes in modern technology. One major area in which many components have to be handled is the application of components to substrates, for example printed circuit boards, in the assembly of electronic circuitry. In the handling of electronic components, specially in placing various components on printed circuit boards, it is essential that the components be positioned precisely at a desired location and in a desired orientation. Many machines have been proposed for accurately placing components on substrates. Some of these previously known machines have included pick-up heads by which components are picked up from a component supply and placed in a desired position and orientation on a suitable substrate. U.S. Pat. Nos. 4,135,630 and 4,290,732 both describe machines for picking up electrical components and placing them at desired positions and orientations on a suitable substrate. The pick-up heads of the machines described in each of these U.S. Patents have a vacuum or suction tool by which components are held on the pick-up head and so-called pawls or fingers by which the components are positioned accurately in correct orientation on the tool. Machines of this type are capable of very precise positioning of components of appropriate size. However, it is frequently necessary to position a number of components of widely varying sizes on a single substrate. By way of example components to be placed on a single board may have sides ranging from 1.25 mm to 31.5 mm in length and may be up to 6.5 mm in thickness. The heretofore known machines, for example of the type described in the aforementioned U.S. Patents, are capable of satisfactorily handling a small range of sizes of components; however, in order to accommodate components of the size variation which it is often necessary to position on substrates, sufficient accuracy and reliability has not been achieved with a single pick-up head without manually adjusting or changing the pawls or fingers, or alternatively providing the components in an already orientated manner. This latter system demands extreme accuracy in delivering components to the pick-up head which requires a component feed means which is dimensionally accurate to very close tolerances and hence which is very expensive - known component feed systems provide components in pockets of reeled tapes or so-called "sticks" in both of which cases it is difficult to ensure that the components supplied are orientated in the component supply sufficiently accurately. In addition, if, in order to achieve sufficiently precise positioning, the component feed is relied on to give the necessary accuracy, there is a considerable period (from picking the components from the component supply to finally placing the components on the substrata) during which the components may be disturbed on the pick-up head thereby losing the orientation and precise positioning of the components. Changing of the pawls or fingers on pick-up heads of the type shown in the aforementioned U.S. Patents would be a most inconvenient and time-consuming operation and, furthermore, it is difficult to ensure that the replacement pawls or fingers are sufficiently precisely mounted on the pick-up head - great care is required to achieve the necessary precision. Accordingly, where components of a wide variety of dimensions have been called for on a single substrate it has been customary to present the substrate to a plurality of pick-up heads each capable of handling components of different and complementary size ranges. Precision pick-up heads are expensive and a plurality of heads is, furthermore, wasteful of space.

OBJECTS OF THE INVENTION

It is one of the various objects of the present invention to provide an improved pick-up head for handling electrical components and orienting the components, which can deal with a bigger range of sizes of components than has hitherto been possible with the a head provided with integral orientation pawls or fingers.

Another object of the present invention is that of providing a machine for handling electrical components including a pick-up head capable of handling components having a wider size range than hitherto possible using a single head machine.

SUMMARY OF THE INVENTION

The above and other objects are achieved by providing an improved pick-up head for handling electrical components. The pick-up head includes a tool holder mounted for movement between a datum position and positions remote therefrom. The tool holder furthermore allows pick-up tools to be interchangeably mounted thereto. This interchangeable mounting feature allows the datum faces of the pick-up tools to be located at a plurality of predetermined positions relative to the tool holder. The pick-up head further comprises a plurality of orienting jaws mounted for movement towards and away from a component carried by a pick-up tool mounted on the tool holder. The jaws have a plurality of spaced sets of cooperating faces which are generally transverse to the datum faces of the pick-up tools in the holder. Each set of faces on the jaws are capable of orienting components carried by a particular pick-up tool.

With a pick-up head having several sets of orienting jaws each set of jaws being arranged to cooperate with corresponding tools which are interchangeable, it is possible to handle a wider range of components than with previously known pick-up heads. Preferably the tool holder of a pick-up head according to the invention has a socket in which a shank portion of a tool can be received to mount the tool on the holder in a located position, the tool holder being conveniently provided with retaining means to retain the shank of the tool in the socket.

A machine for handling electrical components comprising such a new pick-up head also comprises means for facilitating interchanging of the tools. Such a machine comprises a tool support for supporting a plurality of tools and means for relatively moving the pick-up head and tool support whereby to mount a preselected tool carried by the tool support on the tool holder. Provision of such a tool support enables a machine for handling electrical components and, for example, placing the components in predetermined positions on substrates, to operate without any intervention during the operative cycle from the operator to handle a wide variety of components.

BRIEF DESCRIPTION OF THE DRAWINGS

There now follows a detailed description to be read with reference to the accompanying drawings, of a component placing machine having a pick-up head embodying the invention. It will be realized that this machine has been selected for description to illustrate the invention by way of example.

In the accompanying drawings

FIG. 1 is a perspective view of the component placing machine;

FIG. 2 is a perspective view of part of the machine of FIG. 1 showing a pick-up head of the machine with the cover thereof removed;

FIG. 3 is a view in section showing part of the pick-up head;

FIG. 4 is a plan view of part of the machine showing a tool support thereof;

FIG. 5 is a front view showing the tool support of FIG. 4;

FIG. 6 is a diagrammatic plan view showing the relationship of jaws of the pick-up head when in an open condition;

and FIGS. 7 and 8 are perspective views of jaws of the pick-up head.

DESCRIPTION OF THE PREFERRED EMBODIMENT

A component placing machine for handling electrical components, for example so-called "chips", and placing them in predetermined positions on a suitable substrate, for example a printed circuit board or boards embodying the invention is shown in FIG. 1. The component placing machine comprises a frame 10 on which is mounted a pick-up head 12 and a tool support 14 for supporting a plurality of tools 16 and means (to be described in greater detail hereinafter) for relatively moving the pick-up head 12 and tool support 14 whereby to mount a preselected one of the tools 16 carried by the tool support 14 on a tool holder 18 (see FIG. 3) of the pick-up head 12.

The pick-up head 12 (see especially FIGS. 2 and 3) comprises a main support bracket 20 carrying bearings 22 (only the lower bearings shown in FIG. 3) mounting a central spindle 24 of the head 12 for rotation about a vertical axis in the bracket. The tool holder 18 is mounted for vertical sliding movement in a bore 26 in the spindle 24 whereby to raise and lower the tool holder relative to the bracket 20. When the tool holder 18 is fully raised a shoulder 28 of the tool holder 18 abuts a lower end face of the spindle 24 thereby defining a datum position of the tool holder 18 from which the tool holder 18 can be moved to positions remote therefrom.

The pick-up tool 16 may be interchangeably mounted on the holder 18 with a datum face 32 located at a predetermined position relative to the datum position of the tool holder. When the tool holder 18 is in the datum position, the datum face 32 of a tool 16 mounted in the holder 18 will be spaced a preselected distance from the lower end face of the spindle 24 against which the shoulder 28 of the holder 18 abuts.

The pick-up head 12 further comprises a plurality viz. two oppositely disposed pairs of orienting jaws 34, 36 mounted for movement towards and away from a component (not shown) carried by and abutting the datum face 32 of the tool 16 mounted on the tool holder 18 when the holder 18 is in the datum position whereby to engage and orient the component. The jaws 34, 36 have a plurality of vertically spaced sets 38, 40, 42 of cooperating faces which are disposed generally transversely to the plane of the datum face 32 of a tool 16 in the holder 18. Each of the sets 38, 40, 42 is disposed so as to be capable of orienting a component carried by a corresponding tool 16 when mounted in the holder 18. The datum face 32 of the tool 16 will be located relative to the datum position of the holder 18 at a predetermined position. The predetermined positions of the datum face 32 will be spaced vertically so that a component abutting the datum face 32 will be in register with the appropriate one of the sets 38, 40, 42 of faces of the jaws.

As can be seen from FIGS. 2 and 3 the jaws are secured in accurate location at lower end portions of arms 44 which are pivotally mounted by pivot pins 46 carried by a part of the spindle 24. The arms 44 mounting an opposed pair of the jaws 34, 36 are mounted for pivotal movement about horizontal, parallel axes, the axes relating to the jaws 34 being disposed at right angles to the axes relating to the jaws 36. The arms 44 are biased outwardly by a tension spring 48 of generally circular form extending around upper end portions of the arms 44 in grooves 50 therein. Each pair of jaws 34, 36 may be moved in sychronism towards one another by similar means of which only the means operating the pair of jaws 34 (see FIG. 3) will be described in detail. Each pair of jaws may be operated independently of the other pair of jaws.

The means for moving the jaws 34 inwardly towards one another (and towards a component carried by a tool 16 in the holder 18 when the holder is in its datum position) comprises a slide member 52 mounted for sliding movement up and down the spindle 24. A pair of rollers 54 are mounted for rotation on the slide member 52 and engage inclined upper end faces 56 of the arms 44 carrying the jaws 34. Thus, when the slide member 52 is forced downwardly, the rollers 54 slide down the inclined upper end faces 56 and force the upper end portions of the arms 44 outwardly against the action of the tension spring 48, thereby pivoting the jaws 34 inwardly towards one another. When the slide member 52 is lifted, the rollers move upwardly along the faces 56 thereby allowing the spring 48 to urge the upper end portions of the arms 44 inwardly, thereby pivotting the jaws 34 apart; the slide member 52 may be arranged to be raised positively by suitable means or may merely be lifted by action of the spring 48 upon removal of downward pressure from the slide member. The slide member 52 is arranged to be moved by means of a corresponding piston and cylinder arrangement 58 carried by the main support bracket 20 and arranged to operate on a lever 60 pivotted on a pin 62 carried by part of the bracket. An end portion of the lever 60 remote from the piston and cylinder arrangement 58 bears on a collar 64 also slideably mounted for vertical movement relative to a further collar 66 which itself is mounted for vertical sliding movement on the spindle 24. Rods 68, passing freely through openings in flange portion of the collar 66 connect the collar 64 and the slide member 52. Operation of the piston and cylinder arrangement 58 to push an end portion of the lever 60 adjacent the arrangement 58 upwardly causes the end portion of the lever 60 remote from the arrangement 58 (bearing on the collar 64) to move downwardly thereby, through the rod 68, urging the slide member 52 downwardly and thus the jaws 34 towards one another. A piston and cylinder arrangement 70 is similarly arranged to operate a lever 72 pivotted on the brackets 20 whereby to urge the collar 66 downwardly and move a second slide member 74 downwardly (through rods 76) whereby to operate the arms 44 carrying the jaws 36 in a similar fashion. Thus by appropriate timing of the operation of the piston and cylinder arrangement 58, 70 operation of the pairs of jaws 34, 36 may be timed to occur at an appropriate moment or, indeed, it is possible to cause only one of the pairs of jaws to operate in appropriate circumstances, for example when the component to be handled is of cylindrical shape in which case the component would be carried by an appropriate tool grooved to receive the cylinder and only one pair of arms would be used operating upon opposite end portions of the cylindrical component to both align the component lengthwise in the tool and to orient the tool about the vertical axis of the tool holder correctly.

In order to mount a tool 16 in the tool holder 18, the tool holder 18 is provided with a socket in which a shank 78 of the tool is slidingly received. The tool holder 18 comprises retaining means resiliently biased into a recess 81 in the shank 78 of a tool 16 received in the socket to retain the tool 16 on the holder 18. The retaining means preferably comprises at least a pair, of balls 80 held captive in the holder 18 but projecting into the socket, the balls being resiliently biased into the socket by a resilient rubber sleeve 82 surrounding a lower end portion of the holder and operating on portions of the balls 80 projecting from their housing in the holder to urge the balls inwardly of their socket. The tool 16 is accurately located axially of the holder 18 by engagement of a locating face 84 of a projecting collar 86 of the tool with a lower most location face of the tool holder, thus to locate the datum face 32 of the tool 16 relative to the holder 18 so that the datum face 32 is at appropriate predetermined position when the tool holder is at its datum position. A passage 88 extends axially through the tool 16 and opens through the datum face 32. An upper end portion of the passage 88 opens to means for connecting the passage 88 to a vacuum source in the machine, said means being provided by a bore 90 in the tool holder 18 connected by a flexible rubber pipe (not shown) to the vacuum source. It is hence to be appreciated that the tool 16 held in the tool holder 18 constitutes a vacum suction means. It is furthermore to be appreciated that the datum face 32 of the tool 16 is a suction tip of a vacuum suction means.

The tool holder 18 is normally urged upwardly so that the shoulder 28 engages the lower end face of the spindle 24 by means of a tension spring 92 secured to an upper end portion of the tool holder 18 and to an upper end portion of the spindle 24. Above the uppermost end portion of the tool holder 18, the bore 26 of the spindle 24 is of reduced diameter. An upper end portion of the bore 26 is connected to a source of compressed air: on operation of an appropriate valve, air under pressure can be admitted to the bore 26 to subject the tool holder to air under pressure whereby to drive the tool holder downwardly of the spindle 24 against the action of the spring 92. The tool holder 18 and spindle 24 are shaped so that, although the tool holder 18 may move longitudinally of the spindle 24, there is no possibility of the tool holder rotating relative to the spindle 24.

In order that a component held on the tool 16 mounted in the tool holder 18 may be oriented in a desired orientation for placement on a substrate, it is necessary to ensure that when the component has been picked from a suitable component supply to be described in detail hereinafter, it can be rotated through an appropriate angle if necessary. A motor 94 for effecting such rotation is mounted on an upper portion of the main support bracket 20. An output shaft of the motor is connected to an upper end portion of the spindle 24 by a coupling 96. A sensor vane 98 is secured to an upper end portion of the spindle 24 for rotation therewith, the sensor vane 98 cooperating with an optical sensor to provide an indication of the angle through which the spindle 24 has been turned. In the operation of the pick-up head 12, the motor 94 is operated to rotate the spindle 24 until it has turned through a desired angle at an appropriate time in the operative cycle of the head 12. A toothed gear 102 in which the teeth are accurately machined, is also secured to the upper end portion of the spindle 24 below the sensor vane 98. A piston rod 104 of a pneumatic motor 106 is arranged to operate, through a suitable linkage 108, a lock member which can be interposed by operation of the pneumatic motor 106, between the gear teeth of the gear 102 to lock the gear against rotation, thereby locking the spindle 24 in an angular orientation to which it has been rotated. The lock member (not shown) is accurately machined and mounted so that entry of the lock member between a pair of gear teeth locks the spindle 24 in a precisely known angular orientation. In the pick-up head 12 shown in the drawings, the lock member is especially designed to be operated to lock the spindle in one of four angular positions each separated by an angle of 90°; intermediate angular positions may be assumed by the spindle but in these cases the lock member is not employed.

In the machine embodying the invention shown in the accompanying drawings, the tool support 14 is mounted on a support 110 for a substrate 112, the support 110 being mounted for movement along a first path, in a Y direction as will be described hereinafter. The pick-up head 12 is mounted for movement along a second path, in the X direction at right angles to the first path. In order to achieve movement of the pick-up head 12 in the X direction, the pick-head is carried by a carriage 114 on which wheels 116 are mounted for rotation, the wheels 116 running on a rail system 118 secured to the frame 10 of the machine. An accurately machined lead screw 120 is mounted for rotation on the frame 10 and is arranged to be driven by a suitable stepping motor (not shown) also mounted on the frame 10. The lead screw 120 is arranged to drive the carriage 114 through a suitable re-circulating ball mechanism 122 mounted on the carriage 114. Thus by rotating the lead screw 120 through the stepping motor the carriage 114 and thus the head 12 may be moved to an accurately known position in the X direction. The bracket 20 is carried on the carriage 114 through a slide 124 which is received between two pairs of rollers 126 thereby mounting the bracket 20 (and thus the whole pick-up head 12) for vertical movement in a Z direction at right angles to both the X and Y directions whereby to raise and lower the pick-up head as a whole. The pick-up head 12 is driven downwardly between the rollers 126 by means of a stepper motor driving a chain 128 through a suitable gear 130. By operation of the stepper motor, the pick-up head can therefore be moved to a preselected position in the Z direction.

As hereinbefore mentioned the support 110 for the substrate is mounted for movement in the Y direction. The support 110 is mounted on a pair of parallel rails 132 extending in the Y direction. The rails extend sufficiently in the Y direction that the support 110 may be moved to carry any position on a work area of the support on which work area a substrate 112 may be mounted, beneath the path of travel of the pick-up head 12 in the X direction or to carry the tool support 14 which is mounted on a rear portion of the substrate support 110 beneath the path of travel of the pick-up head 12 in the X direction. The support 110 is arranged to be moved in the Y direction by a suitable electric motor 134 rotating a shaft 136 which cooperates with a suitable Rohlex drive mechanism mounted on the support 110. The position of the support 110 along the Y axis is monitored by a suitable optical position detecting means.

A substrate on which components are to be placed may be mounted on the support 110 in accurate location by suitable location means (not shown). The substrate 112 may be a printed circuit board or alternatively a pallet carrying a plurality of printed circuit boards in accurately located positions, on each of which board components are to be placed.

Also mounted on the carriage 114 is an adhesive dispenser 138 of known construction. The adhesive dispenser 138 comprises a container of known construction in which a quantity of a suitable adhesive, for example an epoxy adhesive, is contained. The adhesive dispenser is arranged so that drops of adhesive may be expelled from a nozzle thereof, by pneumatic operation in a known manner. The adhesive dispenser 138 is mounted on the carriage 114 for movement in the Z direction and can be used to apply adhesive to a substrate 112 on the support 110 at any desired position in the work area of the support 110. Whereas the adhesive dispenser 138 is suitable for dispensing an epoxy adhesive from the container, other means of applying adhesive to the substrates may be used, for example an offset-type printer, or the substrates may be supplied with a pre-applied adhesive pattern.

As hereinbefore mentioned the tool support 14 is mounted at a rear edge portion of the support 110. The tool support 14 comprises a base 140 secured to the support 110 and a slide member 142 mounted for sliding movement on an upper face of the base 140. The slide member 142 is retained on the base 140 by headed pins 144, the pins passing through slots 146 in the slide member 142 whereby to guide the slide member 142 for sliding movement in the X direction. A cylinder 148 of a pneumatic piston and cylinder arrangement is mounted on the base 140 and a piston rod 150 of the arrangement is secured to the slide member 142. Thus the slide member 142 may be moved in the X direction by the piston and cylinder arrangement to the extent permitted by the headed pins 144 in the slots 146. A plurality of cylindrical recesses 152 are formed in the base 140, having their centers spaced along a line lying in the X direction. The recesses 152 are dimensioned to receive a nose 154 which projects from the collar 86 of a tool at the opposite side of the collar to the shank 78. Additionally the uppermost surface of the base is recessed to accommodate the collar 86 of the tool 16. The slide member 142 has a slot 156 therein extending in the X direction, the slot 156 being sufficiently wide at all parts to permit the shanks 78 of tools 16, accommodated in the recesses 152, to project upwardly through the slot 156. The slot 156 has enlarged portions 158 which are so dimensioned as to allow clearance for the tool 16 to be withdrawn from the recesses 152 through the enlarged portions 158 when the enlarged portions are aligned with the recesses 152. However when the slide member 142 is moved by the piston and cylinder arrangement so that the enlarged portions 158 and recesses 152 are not in register, portions of the slide member 142 overlie the collars 86 of tools 16 received in the recesses 152 thereby retaining the tools in the recesses.

The tool support 14 therefore comprises a housing, provided by the base 140, by which tools are supported in a plurality of positions, viz. in the recesses 152 with their shanks 78 projecting. The means for moving the pick-up head 12 and for moving the substrate 110 provide means for relatively moving the pick-up head 12 and tool support 14 which are effective in the operation of the machine to engage the shank 78 of one of the tools 16 from a preselected one of the recesses 152 in the socket of the tool holder 18 thus to mount the preselected tool in the holder. The machine further comprises means for moving the tool support 14 along a first path viz. in the Y direction, and means for moving the pick-up head 12 along a second path viz. in the X direction at right angles to the first path to align the tool holder 18 with a preselected one of the tools 16 carried by the tool support 14, and means (including the stepping motor for the pick-up head 12, and the compressed air supply for lowering the tool holder 18) for moving the tool holder when so aligned into engagement with the preselected tool whereby to mount the tool 16 in the holder 18. Of course when a new tool 16 is to be picked up by the tool holder 18 (a previous tool having been removed) it will be necessary to move the slide member 142 by operation of the piston and cylinder arrangement to align the enlarged portions 158 with the recesses 152 so that a leading end portion of the tool holder 18 can be pushed over the shank 78 with the shank 78 received in the socket until the lower most face of the tool holder engages the locating face 84 of the collar 86 and the balls 80 engage the recess 81 in the shank 78. When it is desired to unload a tool from the tool holder 18, the tool holder 18 is first aligned by moving the pick-up head in the X direction and the support 110 in the Y direction, with the particular recess designated for the particular tools 16 to be unloaded. The slide member 142 is then moved to align the enlarged portions 158 with the recesses 152 and the pick-up head and tool holder are lowered to place the particular tool 16 in its appropriate recess. With the pick-up head and tool holder still lowered, the piston and cylinder arrangement are operated to slide the slide member 142 so that the enlarged portions are moved out of alignment with the recesses 152 and portions of the slide member 142 slide over the collars 86. The tool holder 18 and pick-up head 12 are then raised and the balls 80 leave the recess 81, being forced outwardly of the socket against the resilient biasing provided by the rubber sleeve 82; means (not shown) may be provided to assist separation of the tool from the tool holder in addition to the action described above, if necessary. From the above it will be appreciated that the various tools 16 carried by the tool support 14 may be interchanged for one another readily during a cycle operation of the machine, provided that the machine is set-up to carry out the necessary movements.

The machine embodying the invention shown in the drawings further comprises means for supplying components to the pick-head 12 comprising a carriage 160 mounted for movement on rails 162 extending in the Y direction. The carriage 160 is arranged to be driven along the rails 162 by a motor 164 rotating a shaft 166 which moves the carriage 160 by Rohlex drive mechanism (not shown) mounted on the carriage 160. Supported on the carriage 160 are a plurality of component magazines 168. As hereinbefore mentioned any suitable component magazine may be mounted on the carriage 160 and the type of magazine to be used may be selected according to the components to be carried. Amongst the magazines which may be included are so-called "stick" feeders and tape feed magazines (in which the components are received in recesses spaced at equal intervals along a reeled tape which is unreeled to feed the components from the magazine): tape feed magazines are shown in FIG. 1 of the drawings. Each of the magazines 168 contains a number of components which it is desired to place on a substrate. Each magazine has an outlet position at which components may be removed from the magazine: by movement of the carriage along the rails 162 the outlet position of any selected one of the magazines 168 may be moved to a pick-up position. By moving the pick-up head 12 along the rail system 118 the pick-up head 12 may be aligned with the pick-up position. The head 12 and tool holder 18 may then be lowered to lower the datum face 32 of the tool 16 in the tool holder 18 into engagement with the component in the pick-up position. Suction being applied via the passage 18 and bore 90 to hold the component against the datum face 32. The tool holder 18 is then raised to its datum position and the pick-up head 12 raised to lift the component from the pick-up position. Detector means (not shown) are associated with the vacuum supply to the passage 88 which can detect whether or not the tool 16 has succeeded in picking up a component at the pick-up position; other forms of detector for checking whether or not components have successfully been picked up (and placed on a substrate) may be used if desired instead of the detector in the vacuum system.

The operation of the illustrative machine is controlled by a suitable electronic control system which is programmed by an operator, conveniently by a so-called "walk through" method in which the machine is moved at a slow rate by the operator to perform the necessary sequence of operations which are recorded in a memory for subsequent repetition. Before starting the machine operation it is necessary to first ensure that the appropriate tools are accommodated on the tool support 14 and that the magazines 168 carried by the carriage 160 contain the components needed for the placement operation proposed. A suitable substrate, for example a printed circuit board or a pallet carrying a plurality of printed circuit boards, is also accurately located on the substrate support 110. The carriage 114 and the substrate support 110 are then moved respectively in the X and Y directions, together with movement of the carriage 160 in the Y direction, to align the adhesive dispenser 138 and/or pick-up head 12 with positions on the substrate at which adhesive and/or a component is to be placed, or to align the pick-up head with preselected positions of the tool support 14 whereby to interchange tools, or to align the pick-up head with the pick-up position whereby to pick-up the component at the pick-up position. The sequence of movement of the carriage 114 and support 110 is arranged to ensure placing of spots of adhesive and picking and placing of components using the correct tools for the component in the most efficient manner. The control system for the machine is activated to ensure changing of the tools at appropriate moments according to the components which are next to be handled.

A flow control means, adjustable by the operator before the machine is started to the most appropriate level, is provided to control the inward speed of the jaws (by controlling flow of air to the piston and cylinder arrangements 58, 70) the inward speed of the jaws is preferably set to be as rapid as possible to ensure the most rapid machine cycle time, without risking dislodging components which are held on the tool by vacuum: too rapid an inward movement of the jaws may dislodge components. When a component has been picked from the pick-up position by a tool 16 in the tool holder 18 as aforesaid the pick-up head 12 is raised by a suitable amount under the control of the stepping motor associated therewith (the maximum lifting of the head 12 being limited by a stop—not shown), the tool holder 18 also being raised by the tension spring 92 until the tool holder is in its datum position. As the tool holder approaches its datum position the piston and cylinder arrangement 58, 70 are operated (as indicated by the programming of the machine) to pivot the arms 44 inwardly so that as the tool holder reaches its datum position the component carried by the tool 16 is engaged by the appropriate faces of the pairs of jaws 34, 36. The tool 16 in the tool holder 18 will have been selected from the tool support 14 to be appropriate for the dimensions of the component to be picked up and when the tool holder 18 is in its datum position the tool 16 will ensure that the component is held at a heightwise position so that it is engaged by the appropriate one of the sets of faces 38, 40, 42. The faces 40 are intended to align the smallest components, the faces 38 to be used with intermediate sized components and the faces 42 with the largest components which can be handled by the machine. Operation of the jaws is controlled so that the jaws 34 engage the component to be oriented slightly before the jaws 36. Engagement of the component by the appropriate set of jaws causes the component to be correctly oriented and positioned on the tool. As the jaws orient the component on the end of the tool 16 the pick-up head is moved in the X direction from above the pick-up position to position the pick-up head at a preselected location along its path of travel whilst at the same time the support 110 is positioning a particular locus of the substrate 112 beneath the path of travel of the pick-up head. When both the substrate 112 and the pick-up head are positioned in the preselected position so that the pick-up head is in register with a predetermined position on the substrate, the piston and cylinder arrangements 58, 70 are operated to open the jaws thus to release the component, the component being maintained in position on the tool by vacuum applied through the passage 88. The pick-up head 12 is then lowered by the associated stepping motor to a position in which the component is placed just above the substrate 112 on which it is to be placed: the level to which the pick-up head 12 must descend will depend on the thickness of the component to be placed. When the pick-up head 12 has been lowered to its place position air under pressure is admitted to the bore 26 in the spindle 24 thus to lower the spindle 24 (against the action of the tension spring 92) under a preselected pressure which will have been signalled by the operator during the programming of the machine. The component will therefore be pressed against the predetermined position on the substrate 112 under a preselected pressure and held in that position for a short time until the tool 16 and pick-up head 12 are raised. The selected pressure is such as to ensure adequate adhesion of the component in the predetermined position without significant likelihood of damage to the component. If necessary during transport of the pick-up head 12 from above the pick-up position to the place position in its X direction, the spindle 24 will have been rotated by the motor 94 to ensure that the component is placed on the substrate 112 in the desired angular orientation.

After the component has been placed in the desired position on the substrate 112 and the tool 16 is to be raised leaving behind the component, it must be ensured that the component remains on the substrate 112 and does not adhere to the tool 16. To ensure separation of the tool from the component a positive air pressure may be introduced into the passage 88, instead of the vacuum, this being necessary where large components are being placed as the tools used in placing larger components tend to not separate readily from the components. In any event if no positive pressure is used, the vacuum in the passage 88 must be reduced to atmospheric pressure to ensure separation: where smaller components are to be placed use of a positive pressure in the passage 88 may displace the components from the desired position on the substrate and therefore in this instance atmospheric pressure in the passage 88 is preferred.

As can be seen from FIGS. 7 and 8 the set of faces 42 is slightly angled: the angle is chosen to effect a slight camming action of components contacted by the datum faces 42 upwardly so that the components are pressed firmly against the tool 16 thereby ensuring that when the jaws are opened, the components are maintained in the correct location.

The noses 154 of the tools 16 are shaped according to the components which they are intended to handle, the larger components being arranged to be handled by tools having noses with a larger datum face 32 than the smaller components; in FIG. 3 the tool shown is particularly appropriate for handling the smaller size components. The length of the nose 154 projecting beyond the collar 86 to the datum face 32 determines which of the sets of faces 38, 40, 42 will engage as component carried by the tool when the arms 44 are pivoted to move the jaws 34, 36 inwardly.

From the foregoing it will be seen that the pick-up head of the machine described with reference to the drawings can handle a wide range of component sizes without interference by the operator during operation of the machine in a placement cycle, the jaws 34, 36 being capable of orientating components of a wide variety of dimensions as hereinbefore discussed, together with the appropriate tools supplied from the tool support 14.

Where the adhesive dispenser 138 is be used to place spots of adhesive in the operation of the machine, the machine may be controlled to place spots of adhesive first followed by the placing of components on the previously applied spots of adhesive or to alternately place spots of adhesive followed by components or to position components on previously applied spots of adhesive at whatever stage the adhesive has been applied. Adhesive may be applied in the machine for use in subsequent assembly operations or alternatively components may be placed on the substrate on adhesive which has been applied other than in the present machine.

As previously mentioned the machine may handle cylindrical components: in this case the tool to be used will have a nose terminating in a recess complementary with the cylindrical component to be handled and only one pair of jaws will be used to locate the component accurately on the tool, the recess being operative to position the component in cooperation with the single pair of jaw. This system will apply to so-called "Melf" components which are of the aforementioned cylindrical form.

I claim:

1. A pick-up head for handling electrical components including a tool holder mounted for movement between a datum position and positions remote therefrom and having means for interchangeably mounting a plurality of pick-up tools with datum faces located at a plurality of different predetermined positions relative to the tool holder when the tool holder is at the datum position, the pick-up head further comprising a plurality of orienting jaws mounted for movement towards and away from components carried by and abutting the datum faces of the pick-up tools mounted on the toolholder when the tool holder is at the datum position whereby to engage and orient components carried by the pick-up tools, the jaws having a plurality of spaced sets of cooperating faces generally transverse to the planes of the datum faces of the pick-up tools in the tool holder, each set of cooperating faces of the jaws being so disposed as to be capable of orienting a component carried by a corresponding pick-up tool having its datum face located at a respective one of said predetermined positions relative to the tool holder.

2. A pick-up head according to claim 1 in which the tool holder is mounted on a housing of the head for vertical movement between its datum position and said positions remote therefrom and the sets of cooperating faces of the jaws are so disposed as to cooperate with a pick-up tool having its datum face located in a respective one of said predetermined positions.

3. A pick-up head according to claim 2 in which the jaws are carried by arms pivoted on the housing.

4. A pick-up head according to claim 1 in which each set of faces of the jaws is constructed and arranged for operation on components within a range of dimensions.

5. A pick-up head according to claim 1 wherein the pick-up tools have shank portions and wherein the tool holder has a socket in which a shank portion of a pick-up tool can be received so as to mount a pick-up tool on the tool holder.

6. A pick-up head according to claim 5 in which the tool holder comprises retaining means which is resiliently biased into a recess in the shank of a pick-up tool received in the socket so as to retain the pick-up tool on the tool holder.

7. A pick-up head according to claim 6 in which the retaining means comprises a plurality of balls held captive in the tool holder but projecting into the socket, the balls engaging in a recess in the shank of the pick-up tool so as to retain the pick-up tool on the holder.

8. A pick-up head according to claim 1 wherein the tool holder includes a locating face against which each pick-up tool abuts when mounted on the tool holder whereby to locate the datum face of the pick-up tool relative to the tool holder so that the datum face of the pick-up tool is at the respective one of said predetermined positions when the tool holder is at its datum position.

9. A machine for handling electrical components comprising:
   a pick-up head including a tool holder mounted for movement between a datum position and positions remote therefrom and having means for interchangeably mounting a plurality of pick-up tools with datum faces located at a plurality of predetermined positions relative to the tool holder when the tool holder is at the datum position, the pick-up head further comprising a plurality of orienting jaws mounted for movement towards and away from components carried by and abutting the datum faces of pick-up tools mounted on the tool holder when the tool holder is at the datum position whereby to engage and orient components carried by the pick-up tools, the jaws having a plurality of spaced sets of cooperating faces generally transverse to the planes of the datum faces of the pick-up tools in the tool holder, each set of cooperating faces of the jaws being so disposed as to be capable of orienting a component carried by a corresponding pick-up tool having its datum face located at a respective one of said predetermined positions relative to the tool holder;
   a tool support for supporting a plurality of pick-up tools; and
   means for relatively moving the pick-up head and tool support so as to mount a preselected pick-up tool carried by the tool support on the tool holder of said pick-up head.

10. The machine of claim 9 wherein the pick-up tools have shank portions and wherein the tool holder has a socket in which a shank portion of a pick-up tool can be received so as to mount a pick-up tool on the tool holder.

11. The machine of claim 10 wherein said tool support comprises:
   means for supporting pick-up tools in a plurality of positions with their shanks projecting so that said means for relatively moving the pick-up head and tool support causes the shank of a pick-up tool to engage the socket of the tool holder so as to thereby mount a preselected pick-up tool in the tool holder.

12. The machine of claim 9 wherein said tool support comprises:
   means for engaging a pick-up tool carried by the tool holder, separating it from the tool holder, and depositing it in a preselected position of the tool support.

13. The machine of claim 9 wherein said means for relatively moving the pick-up head and tool support comprises:
   means for moving the tool support along a first path;
   means for moving the pick-up head along a second path at right angles to the first path so as to align the tool holder with a preselected one of the pick-up tools carried by the tool support; and
   means for moving the tool holder when so aligned into engagement with the preselected tool.

14. A system for orienting different size electrical components before placing the electrical components on a substrate, said system comprising:
   a plurality of different suction means having suction tips for picking up and holding different size electrical components; and
   means for holding each of said plurality of different suction means so that the suction tips are at different heights relative to a plurality of stepped locating faces disposed on each of at least one pair of opposed locating jaws so that a particular set of stepped faces on the pair of opposed locating jaws move toward a component held on a suction tip at a particular relative height for that size of component so as to thereby orient the component on the suction tip.

15. The system of claim 14 wherein each of said stepped faces is disposed on a respective locating jaw so as to engage a particular width of electrical component held by a suction tip at the height for that width of electrical component.

16. The system of claim 15 wherein each of said suction means is a different length member having a suction tip at one end and said means for holding each of said plurality of different suction means at different heights comprises:
   means for interchangeably mounting said different length members so as to thereby define the height of a suction tip for that different length member relative to the plurality of stepped faces on the locating jaws.

17. A system for orienting various sizes of electrical components that are to be placed on substrates by a placement device, said device including:
   at least one pair of locating jaws which oppose each other, said locating jaws each having a plurality of stepped locating faces thereon which cooperates with similarly stepped locating faces on the opposing locating jaw so as to orient electrical components held on suction tips; and
   means for holding different size electrical components on suction tips at different heights relative to the stepped locating faces on the locating jaws so as to thereby allow different sets of opposed locating faces to orient different sized electrical components on respective suction tips.

18. The system of claim 17 wherein each of said stepped faces is disposed on a respective locating jaw so as to engage a particular width of electrical component held by a suction tip at the height for that width of electrical component.

* * * * *